(12) United States Patent
Song

(10) Patent No.: US 8,531,905 B2
(45) Date of Patent: Sep. 10, 2013

(54) MEMORY APPARATUS AND REFRESH METHOD THEREOF

(75) Inventor: Sang Hyun Song, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 43 days.

(21) Appl. No.: 13/219,624

(22) Filed: Aug. 27, 2011

(65) Prior Publication Data

US 2012/0275239 A1   Nov. 1, 2012

(30) Foreign Application Priority Data

Apr. 29, 2011 (KR) ......................... 10-2011-0040836

(51) Int. Cl.
*G11C 7/00* (2006.01)
(52) U.S. Cl.
USPC .. 365/222; 365/191; 365/189.05; 365/185.12
(58) Field of Classification Search
USPC ................. 365/189.05, 222, 191, 185.12
See application file for complete search history.

(56) References Cited

U.S. PATENT DOCUMENTS

2008/0055997 A1* 3/2008 Lee ...................... 365/185.18

FOREIGN PATENT DOCUMENTS

KR   1020070101092 A   10/2007

* cited by examiner

*Primary Examiner* — Thong Q Le
(74) *Attorney, Agent, or Firm* — William Park & Associates Patent Ltd.

(57) ABSTRACT

A memory apparatus includes a memory cell array comprising a plurality of memory cells connected with a plurality of bit lines and a plurality of word lines, a page buffer unit connected to the plurality of bit lines and latch data read from a memory cell selected from the plurality of memory cells, and a control unit configured to generate a refresh signal according to a prestored current status and provide the refresh signal to the page buffer unit in order to substantially prevent loss of the data latched by the page buffer unit.

20 Claims, 5 Drawing Sheets

MEMORY APPARATUS AND REFRESH METHOD THEREOF

CROSS-REFERENCES TO RELATED APPLICATION

The present application claims priority under 35 U.S.C. §119(a) to Korean application number 10-2011-0040836, filed on Apr. 29, 2011, in the Korean Intellectual Property Office, which is incorporated herein by reference in its entirety.

BACKGROUND

1. Technical Field

The present invention relates generally to a memory apparatus, and more particularly, to a non-volatile memory apparatus and a refresh method thereof.

2. Related Art

A memory apparatus such as a NAND flash memory includes a memory cell array, a page buffer circuit, and a control logic circuit for controlling the memory cell array and the page buffer circuit.

A memory cell array includes a plurality of strings. And each string includes a series of memory cells connected to each other with transistors formed at the ends. The memory cells of the plurality of strings are electrically connected through word lines, and each string is electrically connected to the page buffer circuit for sensing data through bit lines.

The control logic circuit controls the memory cell array and the operation of the page buffer circuit described above.

A page buffer circuit includes a plurality of latch circuits. A page buffer circuit can program a latched data to a memory cell connected to a selected bit line or perform a data read operation by loading and outputting of the data stored in a memory cell, which is connected to a selected bit line, to a latch.

A latch circuit in a page buffer circuit as described above may include a main latch unit having a general latch and a sub-latch unit having a dynamic latch. The general latch of the main latch unit may provide adequate data retention and driving force but hinders the efforts to achieve a high degree of device integration. The dynamic latch of the sub-latch unit is more suitable for achieving a high degree of integration than the general latch but exhibits poor data retention and driving force characteristics. For this reason, it is necessary to periodically perform a refresh operation in a dynamic latch. The number of sub-latch units may vary depending on the programming method, such as a single level cell (SLC) method, a multi-level cell (MLC) method, etc., implemented in the flash memory apparatus.

For performing the refresh operation on the sub-latch unit having the dynamic latch as described above, a signal is generated in the predetermined units of a logic control unit.

Generating the signal to perform the sub-latch unit refresh operation on the sub-latch unit imposes a burden on the logic control unit. Furthermore, when the refresh operation is performed only in the predetermined units of the logic control unit, it may delay an operation time.

SUMMARY

A memory apparatus and a refresh method thereof increases the operation speed of a non-volatile memory apparatus by automatically performing a refresh operation of a page buffer unit.

In an embodiment of the present invention, a memory apparatus comprises: a memory cell array comprising a plurality of memory cells connected with a plurality of bit lines and a plurality of word lines; a page buffer unit connected to the plurality of bit lines and configured to latch data read from a memory cell selected from the plurality of memory cells; and a control unit configured to generate a refresh signal according to a prestored current status and provide the refresh signal to the page buffer unit in order to substantially prevent loss of the data latched by the page buffer unit.

In an embodiment of the present invention, a memory apparatus comprises: a memory cell array comprising a plurality of memory cells connected with a plurality of bit lines and a plurality of word lines; a control unit configured to select one or more memory cells from the plurality of memory cells in response to a read command, and control a data read operation; and a page buffer unit configured to latch data read from the selected one or more memory cells and generate an internal refresh signal in order to substantially prevent loss of the latched data when a control signal is input from the control unit.

A method of refreshing a memory apparatus according to an embodiment of the present invention includes the steps of: selecting one or more memory cells from a memory cell array when a read command input, and reading data from a selected memory cell; latching the read data in a page buffer unit; generating an internal refresh signal when the data is latched in the page buffer unit; and performing a refresh operation by the internal refresh signal.

BRIEF DESCRIPTION OF THE DRAWINGS

Features, aspects, and embodiments are described in conjunction with the attached drawings, in which.

DETAILED DESCRIPTION

Hereinafter, a non-volatile memory apparatus and a refresh method thereof according to various exemplary embodiments of the present invention will be described in detail with reference to the accompanying drawings.

Figure 1:
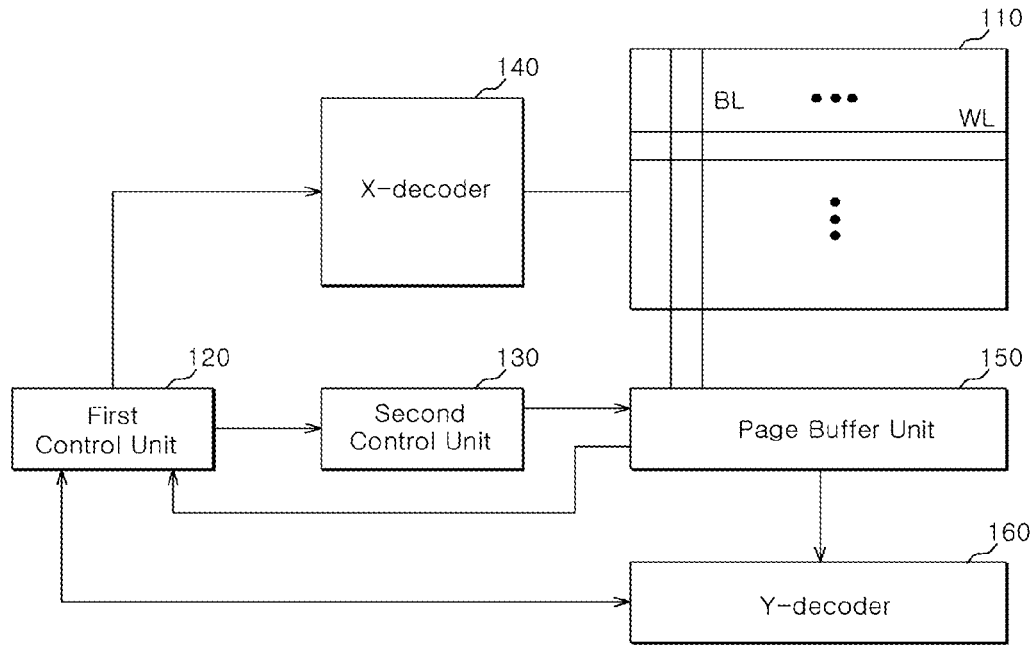
FIG. 1 is a is a block diagram illustrating the configuration of a non-volatile memory apparatus according to an embodiment.
Figure 2:
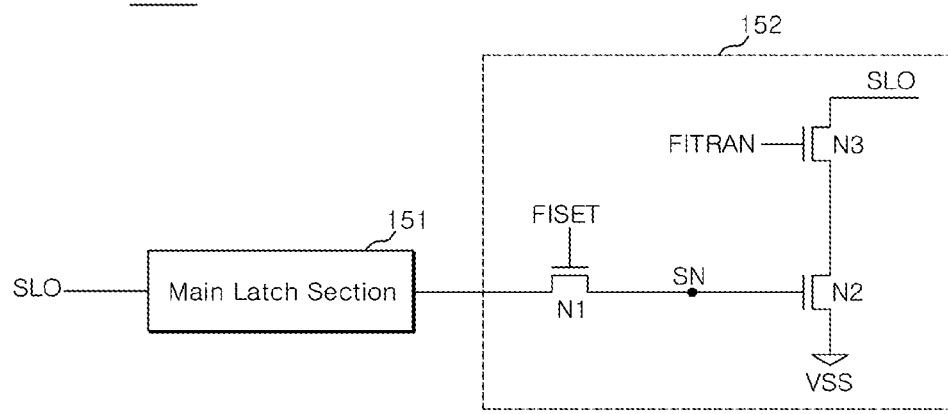
FIG. 2 is a circuit diagram schematically illustrating a part of a page buffer unit of a non-volatile memory apparatus according to an embodiment.
Figure 3:
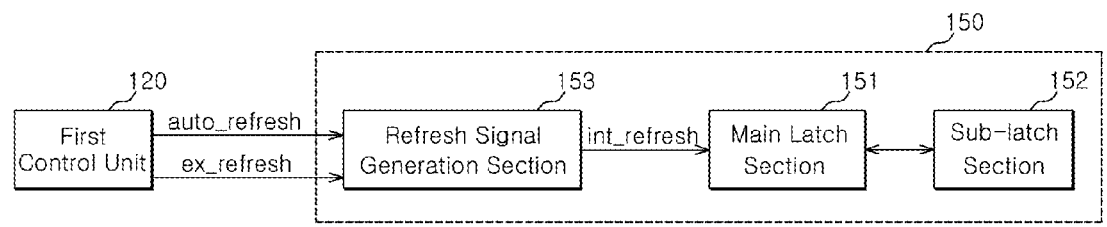
FIG. 3 is a block diagram schematically illustrating a part of a page buffer unit of a non-volatile memory apparatus according to an embodiment.

FIG. 1 is a block diagram illustrating the configuration of a non-volatile memory apparatus according to an embodiment, FIG. 2 is a circuit diagram schematically illustrating a part of a page buffer unit of the non-volatile memory apparatus according to the embodiment, and FIG. 3 is a block diagram schematically illustrating a part of a page buffer unit of a non-volatile memory apparatus according to another embodiment.

Referring to FIG. 1, a non-volatile memory apparatus 100 according to an embodiment includes, inter alia, a memory cell array 110, a first control unit 120, a second control unit 130, an X-decoder 140, a page buffer unit 150, and a Y-decoder 160.

The memory cell array 110 includes a plurality of cells data storage and also includes a plurality of bit lines BL and a plurality of word lines WL for writing to and accessing the stored data in the cells. The plurality of bit lines BL are connected to the page buffer unit 150.

The first control unit 120 receives external signals including a command signal and an address signal and controls the program and erase operations. In addition, the first control unit 120 is configured to generate an external refresh signal to perform a refresh operation on the predetermined units of the page buffer unit 150. Further, the first control unit 120 is configured to generate an auto-refresh pulse that would, in turn, turn on the non-volatile memory apparatus 100 and then allow the second control unit 130 to generate an internal refresh signal, which is in addition to the external refresh signal.

The second control unit 130 is configured to generate an internal refresh signal after determining the status of the electrical current conditions that may have been stored or set in advance, such that an additional refresh operation of the page buffer unit 150 can be automatically performed, which would be in addition to the refresh operation performed in the predetermined units by the external refresh signal generated by the first control unit 120. In an embodiment of the present invention, the second control unit 130 is shown as a separate unit apart from the first control unit 120, which may be a main control unit of the non-volatile memory apparatus 100; however, the scope of the present invention is not limited to this configuration and it should be readily understood that various other configurations are possible. For example, the second control unit 130 may be a part of the first control unit 120 or a main control unit. The second control unit 130 will be described in more detail with reference to FIGS. 4a and 4b.

The X-decoder 140 is configured to receive an address signal from the control unit 120; decode the address signal to generate a decoded signal; and select a partial word line (by which a program operation is to be performed) from the plurality of word lines WL of the memory cell array 110 in correspondence with the decoded signal.

The page buffer unit 150 may include a plurality of page buffer circuits where one or more page buffer circuits may correspond to each bit line pairs BL of the memory cell array 110. The page buffer unit 150 generally includes a latch circuit and may include a main latch section 151 (see FIG. 2) having a general latch in which two inverters are connected in parallel to each other, and a sub-latch section 152 (see FIG. 2) having a dynamic latch.

Now referring to FIG. 2, the main latch section 151 is configured to exchange data with the memory cell array 110. The main latch section 151 may include a general latch circuit having a large driving force in order to exchange the data with the memory cell array 110. A main latch value of the main latch section 151 may be changed according to the data exchanged between the memory cell array 110 and the page buffer unit 150 and a sub-latch output signal SLO.

The sub-latch section 152 may include NMOS transistors N1 to N3 that receive the main latch value from the main latch section 151 and store the main latch value in a storage node SN as a sub-latch value according to a storage enable signal F1SET. Hereinafter, a latch circuit including one transistor will be referred to as a dynamic circuit. Thus, when the sub-latch section 152 receives certain temporary data from the main latch section 151, the sub-latch section 152 should be able to retain the received temporary data while the main latch section 151 is exchanging data with the memory cell array 110. However, the sub-latch section 152 needs to be periodically refreshed because a dynamic latch is included in the sub-latch section 152. In an embodiment of the present invention, a refresh operation is performed in response to the internal refresh signal generated by the second control unit 130 and the external refresh signal generated by the first control unit 120. The refresh operation is performed using the main latch section 151, so the refresh operation is performed when a refresh signal is inputted to the main latch section 151. Although a refresh signal is inputted to the main latch section 151 according to an embodiment of the present invention as shown in FIG. 2, the page buffer unit 150 of the non-volatile memory apparatus 100 is not limited only to the configuration as shown in FIG. 2. For example, the refresh signals generated by the first control unit 120 and the second control unit 130 may not be inputted only to the main latch section 151. That is, the refresh signal inputs may vary depending on the configuration of the page buffer unit 150. For example, a page buffer unit 150 may include one sub-latch section 152 having a dynamic latch for reading or programming 1-bit data, or may include two sub-latch sections 152 having a dynamic latch for reading or programming 2-bit data. However, the number of sub-latch sections 152 that can be included in the page buffer unit 150 is not limited by the above. For example, the sub-latch sections 152 may be appropriately set to a number that is appropriate for performing each program scheme. A page buffer unit 150 according to an embodiment of the present invention can automatically perform refresh operations according to the prestored status of the electrical current conditions of the dynamic latch, which is quite different from performing a refresh operation on all of the predetermined units as in the conventional art, so that it is possible to improve a program operation speed of the non-volatile memory apparatus 100 according an the embodiment.

Now referring to FIG. 3, the page buffer unit 150 according to an embodiment of the present invention may further include a refresh signal generation section 153 in addition to the main latch section 151 and the sub-latch section 152. When the refresh signal generation section 153 is provided in the page buffer unit 150, it may not need to provide the second control unit 130 as described above to the non-volatile memory apparatus 100. This is because the internal refresh signal generated by the second control unit 130 according to a preset current status is generated by the refresh signal generation section 153 provided to the page buffer unit 150. Then, the non-volatile memory apparatus 100 shown in FIG. 1 may include the first control unit 120 but may not separately need the second control unit 130. Furthermore, the refresh signal generation section 153 and the second control unit 130 may have same structure as well as same operational characteristics, and more will be described below with respect to the second control unit 130 shown in FIGS. 4A-4B.

Referring back to FIG. 1, the Y-decoder 160 operates under the control of the first control unit 120 and outputs data temporarily stored in the page buffer unit 150 to the first control unit 120.

The second control unit 130 shown in FIG. 1 of the non-volatile memory apparatus 100 will be described in more detail below.

Figure 4A:
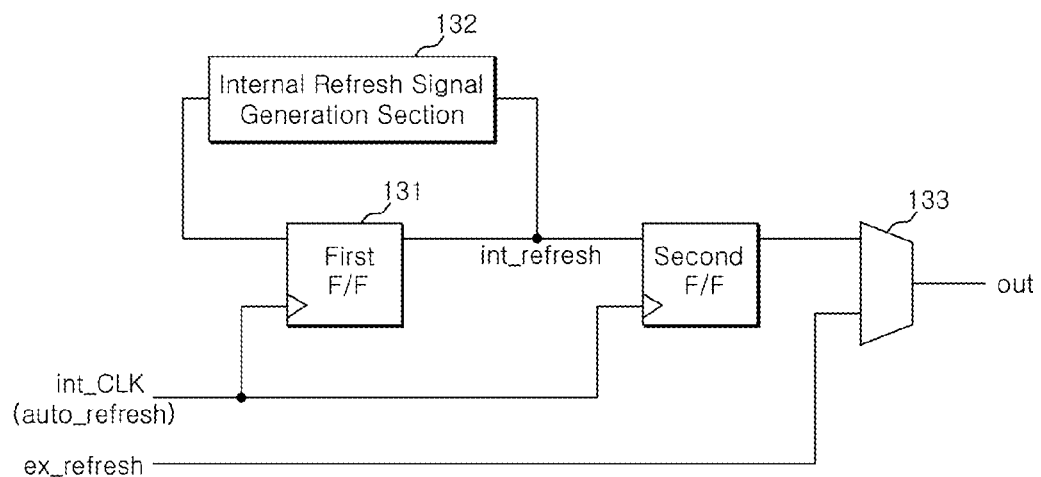
FIGS. 4a and 4b are block diagrams illustrating a second control unit of a non-volatile memory apparatus according to an embodiment.
Figure 4B:
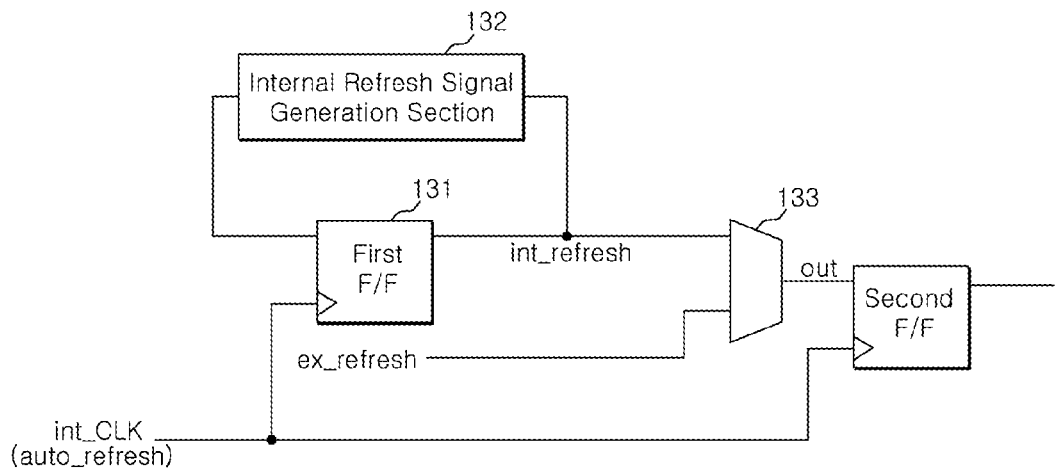

FIGS. 4a and 4b are block diagrams illustrating the second control unit of the non-volatile memory apparatus according to an embodiment.

Referring to FIGS. 4a and 4b, the second control unit 130 of the non-volatile memory apparatus 100 according to an embodiment may include a current status storage section 131, an internal refresh signal generation section 132, and an operation section 133.

The current status storage section 131 is configured to store a plurality of current statuses in advance. The current status storage section 131 may receive voltage and current data provided to the memory cell array 110 from the first control unit 120 and store current statuses, or may store various pieces of data according to the design of a designer. The current status storage section 131 may include a first flip-flop (F/F), which does not have a significant influence on the size of the non-volatile memory apparatus 100.

When the auto-refresh pulse is inputted from the first control unit 120, the internal refresh signal generation section 132 generates the internal refresh signal in synchronization with an internal clock int_CLK such that a refresh operation is automatically performed according to the status of the current status storage section 131.

The operation section 133 may include a multiplexer, and is configured to receive the internal refresh signal and an external refresh signal ex_refresh which is output in preset units from the first control unit 120 and output one signal. The signal out, which is output from the operation section 133, is inputted to the latch circuit of the page buffer unit 150, so that the refresh operation of the sub-latch section 152 including the dynamic latch is performed.

In the second control unit 130 as configured above, for the stabilization of the second control unit 130, a second flip-flop (F/F) may be provided at a predetermined position before an internal refresh signal int_refresh is input to the operation section 133 as illustrated in FIG. 4a, or provided at an output terminal, through which the output signal out is output from the operation section 133, as illustrated in FIG. 4b. When the second control unit 130 is configured as illustrated in FIG. 4a, the external refresh signal ex_refresh, which is inputted in the predetermined units from the first control unit 120, can be outputted without time change, but glitch may occur in the process in which the internal refresh signal int_refresh and the external refresh signal ex_refresh are processed in the operation section 133. When the second control unit 130 is configured as illustrated in FIG. 4b, since the internal refresh signal int_refresh and the external refresh signal ex_refresh are processed, input to the second F/F, and then output from the second F/F, no glitch occurs. FIGS. 4a and 4b illustrate an example in which one second F/F is provided. However, it should be apparent to those in the art that the second F/F may not be provided to the second control unit 130, or one or more second F/Fs may be provided for stabilization.

The operation of the second control unit 130 of the non-volatile memory apparatus 100 according to an embodiment will be described in more detail below.

Figure 5:
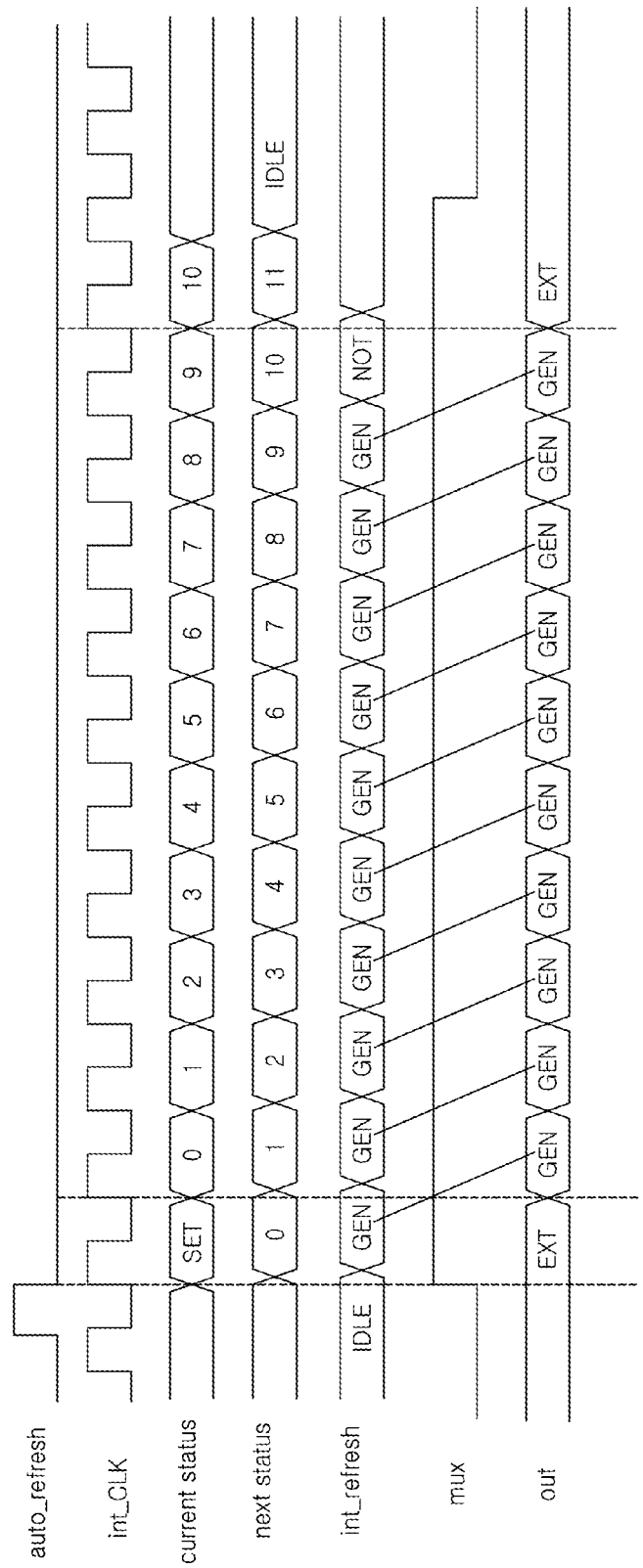
FIG. 5 is a timing diagram explaining the operation of a second control unit of a non-volatile memory apparatus according to an embodiment.

FIG. 5 is a timing diagram explaining the operation of the second control unit of the non-volatile memory apparatus according to an embodiment.

Referring to FIG. 5, the second control unit 130 of the non-volatile memory apparatus 100 according to an embodiment may start from an idle state initially. According to an embodiment, the idle state denotes a state after turning on the non-volatile memory apparatus 100 but before inputting the auto-refresh pulse from the first control unit 120, or a state after outputting a reset signal from the first control unit 120. The auto-refresh pulse is generated by the first control unit 120 and allows the second control unit 130 to operate, that is, serves as a type of start signal of the second control unit 130.

When the auto-refresh pulse is inputted from the first control unit 120 in an idle state as described above, the current status storage section 131 of the second control unit 130 enters a set status, that is, a start status, and the second control unit 130 determines a next status based on current statuses stored in the current status storage section 131 and generates the internal refresh signal int_refresh.

The internal refresh signal int_refresh generated above is outputted through the operation section 133 as the output signal out when the current status is changed from the set status to 1 in FIG. 5. Then, the internal refresh signal int_refresh is automatically inputted to the page buffer unit 150, so that a refresh operation of the sub-latch sections 152 can be automatically performed.

Such a process is performed, separately from the first control unit 120, in such manner that the internal refresh signal int_refresh is continuously generated according to prestored current statuses and thus the refresh operation of the page buffer unit 150 is performed.

As described above, the non-volatile memory apparatus 100 according to an embodiment includes the second control unit 130 to allow the refresh operation of the page buffer unit 150 to be performed in a parallel manner by the external refresh signal generated by the first control unit 120 and the internal refresh signal generated by the second control unit 130 according to the preset current statuses, thereby improving a program operation speed thereof.

A refresh process of the non-volatile memory apparatus 100 according to an embodiment as described above will be described with reference to FIG. 6 below.

Figure 6:
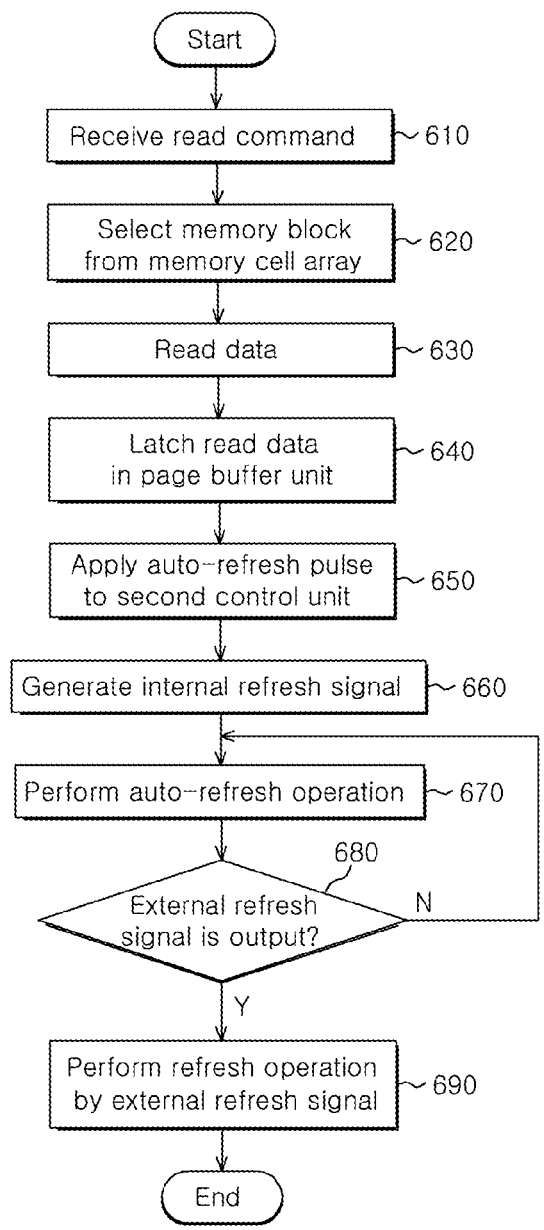
FIG. 6 is a flowchart sequentially illustrating a refresh process of a non-volatile memory apparatus according to an embodiment.

FIG. 6 is a flowchart of the refresh process of the non-volatile memory apparatus according to an embodiment of the present invention.

Referring to FIG. 6, a read command is received in step 610, and the first control unit 120 controls the X-decoder 140 to select one memory block from the memory cell array 110 in step 620.

Next, a voltage with a predetermined level is applied to a word line WL of the selected memory block, and then a voltage is applied to a bit line BL according to the status of a memory cell to allow data to be read from a cell of the selected memory block in step 630. When a memory cell is in an erased state, the voltage of the bit line BL is reduced to a ground voltage. When the memory cell has a voltage with a level higher than that of the voltage applied to the word line WL, the voltage of the bit line BL is increased to a power supply voltage. The current status storage section 131 of the second control unit 130 enters an idle state.

In step 640, the read data is latched by one latch circuit, which is connected to the selected memory block, of a plurality of latch circuits constituting the page buffer unit 150, and the first control unit 120 applies an auto-refresh pulse to the second control unit 130 in step 650.

In step 660, the second control unit 130 prepares to generate an internal refresh signal, that is, enters a start status, and generates the internal refresh signal in synchronization with an internal clock.

Then in step 670, internal refresh signal int_refresh generated by the second control unit 130 is inputted to the page buffer unit 150 in correspondence with the current status data stored in the current status storage section 131, so that a refresh operation is automatically performed regardless of the first control unit 120.

Then, it is determined whether an external refresh signal ex_refresh is outputted in the prestored units from the first control unit 120 in step 680. When it is determined that the external refresh signal is outputted from the first control unit 120, the external refresh signal is inputted to the page buffer unit 150, so that the refresh operation is performed in step 690. When it is determined that the external refresh signal is not inputted to the second control unit 130, an internal refresh operation is automatically performed according to the data stored in the current status storage section 131 of the second control unit 130 in step 670.

As described above, in the non-volatile memory apparatus 100 and the refresh method thereof according to an embodiment, differently from the refresh operation of the page buffer unit 150 performed in predetermined units by the first control unit 120, the second control unit 130 for generating the internal refresh signal is provided and the refresh operation of the page buffer unit 150 is automatically performed separately from the first control unit 120, thereby improving the operation speed of the non-volatile memory apparatus 100.

While certain embodiments have been described above, it will be understood to those skilled in the art that the embodiments described are by way of example only. Accordingly, the non-volatile memory apparatus and the refresh method thereof described herein should not be limited based on the described embodiments. Rather, the non-volatile memory apparatus and the refresh method thereof described herein should only be limited in light of the claims that follow when taken in conjunction with the above description and accompanying drawings.

What is claimed is:

1. A memory apparatus comprising:
    a memory cell array comprising a plurality of memory cells connected with a plurality of bit lines and a plurality of word lines;
    a page buffer unit connected to the plurality of bit lines and configured to latch data read from a memory cell selected from the plurality of memory cells; and
    a control unit configured to generate a refresh signal according to a plurality of prestored current statuses and provide the refresh signal to the page buffer unit in order to automatically perform a refresh operation by the page buffer unit.

2. The memory apparatus according to claim 1, wherein the page buffer unit comprises a plurality of general latch circuits and a plurality of dynamic latch circuits.

3. The memory apparatus according to claim 1, wherein the control unit comprises:
    a first control unit configured to select one or more memory cells from the memory cell array and latch data of the selected one or more memory cells to the page buffer unit; and
    a second control unit configured to generate an internal refresh signal in order to automatically perform the refresh operation by the page buffer unit after receiving a control signal from the first control unit and output an internal refresh signal to the page buffer unit.

4. The memory apparatus according to claim 3, wherein the first control unit is configured to generate an external refresh signal for a predetermined number of units and output the external refresh signal to the page buffer unit.

5. The memory apparatus according to claim 4, wherein the second control unit comprises:
    a current status storage section configured to store a plurality of current status data;
    an internal refresh signal generation section configured to generate the internal refresh signal in correspondence to the data stored in the current status storage section; and
    an operation section configured to process and output the internal refresh signal generated by the internal refresh signal generation section and the external refresh signal generated by the first control unit.

6. The memory apparatus according to claim 5, wherein the current status storage section comprises a flip-flop.

7. The memory apparatus according to claim 6, wherein the current status storage section has an idle value when no control signal is input from the first control unit.

8. The memory apparatus according to claim 5, wherein the second control unit further comprises:
    a flip-flop configured to stabilize output of the internal refresh signal.

9. The memory apparatus according to claim 5, wherein the operation section is configured to output the internal refresh signal when the external refresh signal is not generated but the internal refresh signal is generated, or to output the external refresh signal in response to the external refresh signal.

10. A memory apparatus comprising:
    a memory cell array comprising a plurality of memory cells connected with a plurality of bit lines and a plurality of word lines;
    a control unit configured to select one or more memory cells from the plurality of memory cells in response to a read command and control a data read operation; and
    a page buffer unit configured to latch data read from the selected one or more memory cells and generate an internal refresh signal in order to automatically perform a refresh operation when a control signal is inputted from the control unit.

11. The memory apparatus according to claim 10, wherein when the read operation of the memory cell array is performed and read data is latched by the page buffer unit, the control unit provides the control signal to the page buffer unit such that the internal refresh signal is generated.

12. The memory apparatus according to claim 11, wherein the control unit is configured to generate an external refresh signal in a predetermined number of units and provide the external refresh signal to the page buffer unit.

13. The memory apparatus according to claim 12, wherein the page buffer unit comprises:
    a main latch section configured to latch the data read from the memory cell array;
    a sub-latch section configured to receive a latch value latched by the main latch section and latch the latch value as a sub-latch value; and
    a refresh signal generation section configured to generate an internal refresh signal in correspondence with a plurality of prestored current statuses when an auto-refresh pulse is input from the control unit, and input the internal refresh signal to the main latch section.

14. The memory apparatus according to claim 13, wherein the main latch section comprises a general latch in which two inverters are connected in parallel to each other.

15. The memory apparatus according to claim 13, wherein the sub-latch section includes a dynamic latch including a transistor.

16. The memory apparatus according to claim 13, wherein the refresh signal generation section comprises:
    a first flip-flop configured to store the plurality of prestored current statuses;
    an internal refresh signal generation part configured to sequentially generate an internal refresh signal according to the plurality of current statuses stored in the first flip-flop;
    an operation part configured to process the internal refresh signal generated by the internal refresh signal generation part and the external refresh signal input from the control unit; and
    a second flip-flop provided for stabilization of the operation part or the internal refresh signal generated by the internal refresh signal generation part.

17. The memory apparatus according to claim 16, wherein the operation part is configured to output the internal refresh signal when the external refresh signal is not generated but when the internal refresh signal is generated, or to output the external refresh signal in response to the external refresh signal.

18. A method of refreshing a non-volatile memory apparatus, comprising the steps of:
- selecting one or more memory cells from a memory cell array in response to a read command and reading data from the selected one or more memory cells;
- latching the read data in a page buffer unit;
- generating an internal refresh signal in order to automatically perform a refresh operation when the data is latched in the page buffer unit; and
- performing a first refresh operation by the internal refresh signal.

19. The method of claim 18, further comprising:
- after performing the first refresh operation, performing a second refresh operation in response to the external refresh signal.

20. The method of claim 18, wherein the internal refresh signal is sequentially generated in synchronization with an internal clock according to a plurality of prestored current statuses in the step of generating the internal refresh signal.

* * * * *